United States Patent [19]

Boutle et al.

[11] 4,289,843
[45] Sep. 15, 1981

[54] PHOTOPOLYMERIZABLE ELEMENT HAVING INITIATOR IN ADHESIVE LAYER

[75] Inventors: David L. Boutle, Colchester; Stuart C. Rennison, Hadleigh; Stuart G. Lambert, Colchester, all of England

[73] Assignee: Bexford Limited, London, England

[21] Appl. No.: 963,939

[22] Filed: Nov. 21, 1978

Related U.S. Application Data

[63] Continuation-in-part of Ser. No. 873,955, Jan. 31, 1978, abandoned.

[30] Foreign Application Priority Data

Nov. 29, 1977 [GB] United Kingdom ............ 49610/77

[51] Int. Cl.³ .................. G03C 1/76; G03C 1/68
[52] U.S. Cl. ........................ 430/271; 430/275; 430/281; 430/306; 430/523; 430/524; 430/905; 430/910; 430/911; 430/916; 430/919; 430/923
[58] Field of Search ............ 96/115 R; 430/271, 275, 430/281, 300, 306, 523, 524, 905, 910, 911, 916, 919, 923

[56] References Cited

U.S. PATENT DOCUMENTS

| | | | |
|---|---|---|---|
| 3,427,161 | 2/1969 | Lariden et al. | 96/115 R |
| 3,556,792 | 1/1971 | Katz | 96/115 R |
| 3,756,827 | 9/1973 | Chang | 96/86 P |
| 3,847,771 | 11/1974 | McGinniss | 204/159.18 |
| 3,945,833 | 3/1976 | Sumita et al. | 204/159.16 |

FOREIGN PATENT DOCUMENTS

| | | |
|---|---|---|
| 656511 | 6/1965 | Belgium . |
| 1535367 | 8/1968 | France . |
| 973955 | 11/1964 | United Kingdom . |
| 1090142 | 11/1967 | United Kingdom . |
| 1314556 | 4/1973 | United Kingdom . |
| 1321108 | 6/1973 | United Kingdom . |
| 1458209 | 12/1976 | United Kingdom . |
| 1505505 | 3/1978 | United Kingdom . |

OTHER PUBLICATIONS

Derwent Japanese Patents Report, vol. 75, No. 26, Section G, p. 2, Jul. 25, 1975.
Chemical Abstracts, vol. 68, 60,636a (1968).
Chang, Chemical Abstracts, vol. 75, 82,435f (1971).
Chemical Abstracts, vol. 84, 52,130w (1976).

*Primary Examiner*—Jack P. Brammer
*Attorney, Agent, or Firm*—Cushman, Darby & Cushman

[57] ABSTRACT

A photopolymerizable element suitable for use in the production of photorelief printing plates comprises a film or sheet, an adhesive layer and a photopolymerizable layer wherein the adhesive layer comprises a non-photopolymerizable plastics binder and a photopolymerization initiator comprising an admixture of a compound of the formula:

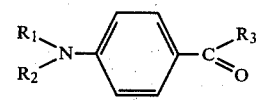

preferably 4,4'-bis(dimethylamino)-benzophenone in an amount 0.01 to 2.0% by weight based upon the weight of the binder and another photopolymerization initiator in an amount 0.1 to 7% by weight based upon the weight of the binder.

10 Claims, 4 Drawing Figures

PHOTOPOLYMERIZABLE ELEMENT HAVING INITIATOR IN ADHESIVE LAYER

This is a continuation-in-part of our application Ser. No. 873,955 filed Jan. 31, 1978 now abandoned.

The present invention relates to photopolymerisable elements suitable for use in the production of relief printing plates.

Relief printing plates formed from transparent thermoplastics film supports are described in British patent specification No. 1,321,108. Such printing plates are produced by exposing a photopolymerisable element comprising a photopolymerisable layer applied to the film support to actinic light through a master such as a photographic image. Non-light-struck areas of the photopolymerisable layer are washed away by treatment with a suitable solvent to leave a photopolymerised relief printing pattern in the light-struck areas.

The adhesion of the relief printing pattern to the film support should ideally resist damage during repeated use, e.g. in rotary printing machines.

The present invention relates to a photopolymerisable element comprising an adhesive layer which is capable of promoting tenacious adhesion between the film support and a photopolymerisable layer applied over the adhesive layer.

According to the present invention a photopolymerisable element comprises a self-supporting plastics film or sheet having an adhesive layer superimposed upon at least one surface thereof and a photopolymerisable layer superimposed upon the adhesive layer, said adhesive layer comprising a non-photopolymerisable plastics binder and a photopolymerisation initiator comprising an admixture of:

(i) a compound having the formula:

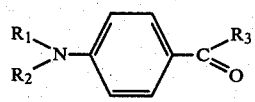

wherein $R_1$ and $R_2$ are the same or different and are selected from hydrogen, or a lower alkyl group having up to 6 carbon atoms and $R_3$ is the same as or different from $R_1$ or $R_2$ and is selected from hydrogen, a lower alkyl group having up to 6 carbon atoms, a partially or completely halogenated alkyl group having up to 6 carbon atoms or a group of the formula:

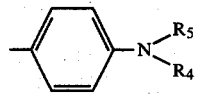

in which $R_5$ and $R_4$ are the same or different and are selected from the same substituents as $R_1$ and $R_2$, said compound being present in an amount 0.01 to 2.0% by weight based upon the weight of the plastics binder; and (ii) another photopolymerisation initiator present in an amount 0.1 to 7% by weight based upon the weight of the plastics binder.

It will be appreciated that the essential ingredients of the adhesive layer are the non-photopolymerisable binder and the admixture of photopolymerisation initiators. The adhesive layer does not contain a photopolymerisable component and has no photopolymerisation activity.

$R_1$ and $R_2$ of compound (i) are preferably lower alkyl groups having up to 6 carbon atoms and most preferably both are methyl groups. $R_3$ is preferably hydrogen, $CF_3$ or:

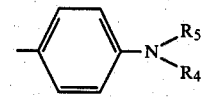

in which $R_5$ and $R_4$ are lower alkyl groups having up to 6 carbon atoms and most preferably both are methyl groups. Compound (i) may be:

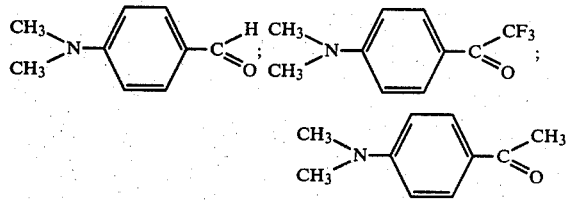

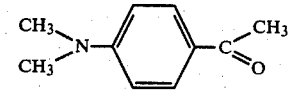

or most preferably 4,4'-bis(dimethylamino)-benzophenone, i.e.

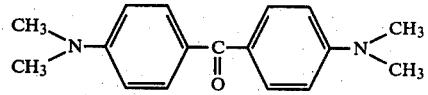

The photopolymerisation initiator admixture in the adhesive layer is particularly effective in promoting the adhesion of a polymerised photopolymerisable layer via the adhesive layer to the plastics film or sheet, e.g. in photorelief printing plates.

Amounts less than 0.01% by weight of the photopolymerisation initiator (i) in the adhesive layer are ineffective in providing adequate adhesion to the photopolymerised layer whilst amounts thereof exceeding 2.0% by weight tend to introduce surface defects resulting from crystallisation of the initiator (i) upon the surface of the adhesive layer prior to the application of the photopolymerisable layer and have a high absorption of ultra-violet light which is preferably used to polymerise the photopolymerisable layer thereby leading to inconveniently long exposure times. Adhesions are particularly effective when the amount of the photopolymerisation initiator (i), especially 4,4'-bis(-dimethylamino)-benzophenone, is in the range 0.01 to 1.0% and preferably 0.01 to 0.5% by weight.

The photopolymerisation initiator (ii) may be any material having suitable photopolymerisation initiating activity and may preferably be chosen from benzoin, benzoin isopropyl ether, benzoin isobutyl ether, benzoin methyl ether, benzoin ethyl ether, α-methyl benzoin, benzil, anthraquinone, diacetyl anthraquinone, 1-chloroanthraquinone, 9,10-phenanthraquinone, diphenyl disulphide, 2-naphthalenesulphonyl chloride, ω-bromoacetophenone, eosin, thionin, and benzophenone.

Amounts of the photopolymerisation initiator (ii) less than 0.1% by weight do not provide adequate adhesion to the photopolymerised layer whilst amounts thereof exceeding 7% by weight tend to result in some surface crystallisation of the initiator (ii) prior to the application of the photopolymerisable layer. Particularly effective adhesion and avoidance of surface crystallisation is achieved when the photopolymerisation initiator (ii) is present in an amount in the range 0.25 to 5.0% by weight based upon the weight of the plastics binder.

A preferred photopolymerisation initiator mixture for use in the adhesive layer of the invention includes isopropyl benzoin ether and 4,4'-bis(dimethylamino)-benzophenone. Such an admixture is particularly effective when it includes about 5.0% by weight of isopropyl benzoin ether and about 0.25% by weight of the 4,4'-bis(dimethylamino)-benzophenone, both amounts being based upon the weight of the plastics binder.

The total amount of the photopolymerisation initiator admixture in the adhesive layer of the element according to the invention is insufficient to cause crystal migration of either photopolymerisation initiator to the surface of the adhesive layer and provides good adhesion to the photopolymerised layer.

The non-photopolymerisable plastics binder included in the adhesive layer may be chosen from any suitable thermoplastics polymer such as cellulose esters, e.g. cellulose acetate propionate, homopolymers and copolymers of vinyl halogenoesters, polyurethanes, alkyd resins, polymers and copolymers of acrylic acid and/or methacrylic acid and/or esters thereof, synthetic rubbers, e.g. polychloroprene, polymers and copolymers of vinyl acetate which may optionally be partially hydrolysed, e.g. a partially hydrolysed copolymer of vinyl acetate and vinyl chloride, polymers and copolymers of vinyl chloride or vinylidene chloride, epoxy resins and polymers and copolymers of vinyl butyral.

Copolymers of vinyl halogenoesters suitable for use as the plastics binder preferably comprise copolymers of vinyl mono-, di- or trihalogenoacetate, especially vinyl mono-, di- or trichloroacetate, formed with one or more ethylenically unsaturated copolymerisable comonomers, especially one or more comonomers chosen from α,β-unsaturated carboxylic acids, vinyl acetate and vinyl alcohol. Copolymers of vinyl monochloroacetate are particularly effective binders and may for example comprise 1 to 60 mole % of an α,β-unsaturated carboxylic acid, e.g. crotonic acid, or 1 to 60 mole % of vinyl acetate and/or vinyl alcohol, e.g. a copolymer comprising 56 mole % vinyl monochloroacetate, 43 mole % vinyl alcohol and 1 mole % vinyl acetate.

Polyurethane resins suitable for use as the plastics binder may comprise one or more linear, substantially unreactive, organic media soluble, saturated synthetic block copolymers formed by the condensation of one or more hydroxy-terminated polyester, polyether, polyesteramide or a similar suitable material with one or more diisocyanates optionally together with, e.g. a chain extender, low molecular weight difunctional alcohol, difunctional amine, amino alcohol.

Polyurethanes derived from hydroxy-terminated polyesters are preferably produced from linear polyesters of low acid number, low water content and having a molecular weight in the range of 200–5000. Such hydroxy-terminated polyesters may be formed by the esterification of one or more glycols such as ethylene glycol, propylene glycol, 1,3-butane diol, 1,4-butane diol, diethylene glycol or a polyether polyol with one or more carboxylic acids, carboxylic acid chlorides or carboxylic acid anhydrides such as adipic acid, sebacic acid, terephthalic acid, isophthalic acid or phthalic anhydride, or by the polymerisation of cyclic monomers such as ε-caprolactone. Suitable polyesters of this class include polyethylene adipate, polytetramethylene adipate, an ethylene/tetramethylene adipate copolyester, an ethylene glycol/diethylene glycol adipate copolyester or a polycaprolactone polyol.

The preferred polyether polyols, e.g. poly(oxytetramethylene)glycol, have a molecular weight in the region of 200–5000 and may be formed by the homopolymerisation or copolymerisation of materials such as ethylene oxide, propylene oxide and tetrahydrofuran.

Polyurethanes derived from hydroxy-terminated polyesteramides are preferably formed from saturated and linear, polyesteramides having low acid numbers and water contents and a molecular weight in the range of 200–5000 and may be formed by the reaction of a difunctional carboxylic acid or carboxylic acid anhydride or a mixture of the two, with one or more amino alcohols, with a mixture of one or more amino alcohols with one or more diols or diamines or with a mixture of one or more diols with one or more diamines. Reactions for the production of suitable polyesteramides may be effected between carboxylic acids or carboxylic acid anhydrides such as adipic acid, sebacic acid, terephthalic acid, isophthalic acid and phthalic anhydride and amino alcohols such as ethanolamine optionally in admixture with diols or diamines such as ethylene glycol, diethylene glycol or ethylene diamine. The preferred polyesteramide is prepared from adipic acid with a mixture of ethylene glycol, diethylene glycol and ethanolamine.

If a chain extender is employed it may be any low molecular weight aromatic or aliphatic difunctional alcohol, difunctional amine, amino alcohol or a mixture of two or more of these materials, optionally containing traces of trifunctional alcohols or amines. Preferred chain extenders include 1,3-butane diol, 1,4-butane diol, ethylene glycol, diethylene glycol, ethanolamine and ethylene diamine.

The di-isocyanate may be any difunctional aromatic or aliphatic isocyanate or a mixture of any two or more of these materials, but preferably is an isomer or mixture of isomers of tolylene di-isocyanate, or is diphenyl methane 4,4'-di-isocyanate, 1,5-naphthalene di-isocyanate or hexamethylene di-isocyanate.

The preferred polyurethane resins have a molecular weight in the range 1000 to 250,000 and are those formed (1) by the condensation of one mole of polyethylene adipate with one mole of a 65/35% by weight mixture of 2,4-tolylene di-isocyanate with 2,6-tolylene di-isocyanate, (2) from the condensation of one mole of polytetramethylene adipate and one mole of 1,4-butane diol with two moles of diphenyl methane 4,4'-di-isocyanate, (3) by the reaction of one mole of a polyesteramide, prepared from adipic acid, diethylene glycol, ethylene glycol and ethanolamine, and 0.2 moles of ethylene glycol with 1.2 moles of an 80/20% by weight mixture of 2,4-tolylene di-isocyanate with 2,6-tolylene di-isocyanate and (4) by the condensation of one mole of polyethylene adipate of molecular weight 2000 and one mole of 1,4-butane diol with two moles of an 80/20% by weight mixture of 2,4-tolylene di-isocyanate and 2,6-tolylene di-isocyanate.

The adhesive layer may include up to 10% by weight based upon the weight of the plastics binder of one or more inert particulate materials to improve such properties as slip and resistance to blocking which are important for the general handling and reeling properties of film substrates to which the adhesive composition may be applied. Suitable particulate materials include inorganic particles such as particles of silica and alumina hydrate having an average particle size in the range 0.1 to 30 μm.

The adhesive layer is preferably applied to the surface of the film or sheet as a solution in an organic solvent such as a ketone, a chlorinated hydrocarbon, or an alcohol, e.g. acetone, methyl ethyl ketone, methylene chloride or methanol, by any suitable known coating technique. After application from such a solution, the adhesive layer is preferably dried to a dry coating thickness of from 0.05 to 20 μm, and most preferably from 0.1 to 10 μm. Thicknesses less than 0.05 μm provide poor adhesion to the film whilst thicknesses exceeding 20 μm may incur cohesive failure within the adhesive layer.

The self-supporting plastics film or sheet may consist of any suitable plastics material such as films or sheets of cellulose esters, e.g. cellulose acetate, polystyrene, polyamides, polymers and copolymers of vinyl chloride, polycarbonate polymers and copolymers of olefines, e.g. polypropylene, polysulphones and linear polyesters which may be obtained by condensing one or more dicarboxylic acids or their lower alkyl diesters, e.g. terephthalic acid, isophthalic, phthalic, 2,5-, 2,6- and 2,7-naphthalene dicarboxylic acid, succinic acid, sebacic acid, adipic acid, azelaic acid, diphenyl dicarboxylic acid, and hexahydroterephthalic acid or bis-p-carboxyl phenoxy ethane, optionally with a mono-carboxylic acid, such as pivalic acid, with one or more glycols, e.g. ethylene glycol, 1,3-propanediol, 1,4-butanediol, neopentyl glycol and 1,4-cyclohexanedimethanol. Biaxially oriented and heat-set films of polyethylene terephthalate are particularly useful for the production of the film supports according to this invention and may be produced by any of the processes known in the art, e.g. as described in British patent specification No. 838,708.

The surface of polyester film supports may be subjected to an adhesion-promoting pretreatment prior to coating with the adhesive layer. The pretreatment may preferably involve subjecting the film surface to the action of a material having a swelling or solvent action upon the film, e.g. a solution in a common organic solvent such as acetone or methanol of 0.5 to 20% by weight of p-chloro-m-cresol, 2,4-dichlorophenol, 2,4,6- or 2,4,5-trichlorophenol or 4-chlororesorcinol or a mixture of such materials in a common organic solvent. If desired, the pretreating solution may also include an adhesion-promoting resin such as a partially hydrolysed or unhydrolysed copolymer of vinyl chloride-vinyl acetate. After such a solution has been applied to the film surface it is dried at an elevated temperature for a few minutes before applying the adhesive composition.

Alternatively, the pretreatment step may be omitted and the material having the swelling or solvent action on the polyester film may be included in the adhesive composition, the amount of the swelling or solvent component comprising approximately 5 parts by weight to one part by weight of the copolymer component.

The photopolymerisable element may be produced by the printing plate manufacturer by casting a liquid photopolymerisable layer upon the adhesive layer which has already been applied to the film or sheet. Alternatively, the production of the printing plates may commence with a photopolymerisable element as defined above, i.e. an element comprising the film or sheet, the adhesive layer and the photopolymerisable layer.

The photopolymerisable layer may comprise an organic unsaturated material which is capable of being polymerised in the presence of a photopolymersation initiator upon exposure to active radiation generally in the wavelength range 2000 to 8000 Angstroms and a suitable photopolymerisation initiator. The photopolymerisable organic unsaturated material may include an ethylenically unsaturated addition polymerisable monomer and/or an unsaturated polymer. Suitable ethylenically unsaturated addition polymerisable monomers, as described in British patent specification No. 1,321,108, include styrene, chlorostyrene, vinyltoluene, diallylphthalate, diallylisophthalate, triallylcyanurate, N,N'-methylenebisacrylamide, N,N'-hexamethylenebisacrylamide, stearyl acrylate, acrylamide, methacrylamide, N-hydroxyethylacrylamide, N-hydroxymethacrylamide, α-acetamido-acrylamide, acrylic acid, methacrylic acid, α-chloroacrylic acid, p-carboxystyrene, 2,5-dihydroxystyrene, methyl acrylate, methyl methacrylate, n-butyl acrylate, isobutyl acrylate, ethylene glycol diacrylate, ethylene glycol dimethacrylate, diethylene glycol diacrylate, diethylene glycol dimethacrylate, triethylene glycol diacrylate, triethylene glycol dimethacrylate, trimethylene glycol diacrylate, trimethylene glycol dimethacrylate, tetraethylene glycol diacrylate and tetraethylene glycol dimethacrylate.

Suitable unsaturated polymers include unsaturated polyesters and unsaturated polyurethanes. Such unsaturated polyesters may be obtained by reacting diols such as ethylene glycol, diethylene glycol, triethylene glycol, tetraethylene glycol, polyoxyethylene glycol of the formula:

$$HO-(CH_2-CH_2-O)_n-H$$

wherein n is an integer of 5 to 50, propylene glycol, dipropylene glycol, polyoxypropylene glycols of the formula:

$$HO-(CH_2-CH-O)_m-H$$
$$\qquad\qquad\quad |$$
$$\qquad\qquad\ CH_3$$

wherein m is an integer of 3 to 30, polyoxybutylene glycols of the formula:

$$HO(CH_2-CH_2-CH_2-CH_2-O)_x-H$$

wherein x is an integer of 2 to 30 and copolyglycols comprising $-(CH_2-CH_2-O)_a-$ groups and $-(CH_2-CH-O)_b-$ groups, wherein a and b, which may be the same or different, are integers from 2 to 50, with unsaturated dicarboxylic acids such as maleic acid, fumaric acid, itaconic acid, mesaconic acid, glutaconic acid, or the esters or the anhydrides thereof, for example, the dimethyl or diethyl esters or maleic anhydride.

Such unsaturated polyurethanes may be obtained by reacting unsaturated polyesters having terminal hydroxyl groups with polyisocyanates such as tolylene di-isocyanate and diphenylmethane di-isocyanate. The unsaturated polyesters having terminal hydroxyl groups are produced by the polycondensation reaction of the above-mentioned unsaturated dicarboxylic acids and excess diols mentioned above.

A photopolymerisation initiator is preferably included in the photopolymerisable layer and may consist of one or more of those initiators listed above as being suitable for use as the initiator (ii) in the adhesive layer. The amount of such photopolymerisation initiator used in the photopolymerisable material is preferably in the range of from 0.001 to 10% by weight based upon the total weight of the photopolymerisable composition. If desired, a photopolymerisation initiator having the structure of the initiator (i) of the adhesive layer may optionally be included in the photopolymerisable layer.

Known stabilisers may be employed for the purpose of maintaining storage stability (shelf life) of the photopolymerisable material. Exemplary stabilisers include hydroquinone, mono-tert-butyl hydroquinone, benzoquinone, 2,5-diphenyl-p-benzoquinone, pyridine, phenothiazine, p-diaminobenzene, β-naphthol, naphthylamine, pyrogallol, cuprous chloride and nitrobenzene. These stabilisers are added only for completely preventing polymerisation reaction in the absence of actinic radiation such as that used in the production of printing plates. The amount of the stabilisers may preferably be about 0.005 to 3.0% by weight of the total weight of the photopolymerisable composition.

Fillers or binders may also be employed for the photopolymerisable layer. Examples of suitable binders include cellulose esters such as acetyl cellulose, cellulose acetate, hydrogen succinate, nitrocellulose, cellulose acetate propionate and cellulose butyrate, polyvinylalcohol derivatives such as polyvinylbutyral, polyamide such as poly-ε-caprolactam, polyhexamethylene sebacamide, copoly(ε-caprolactamhexamethylene sebacamide and/or adipamide), and of suitable fillers include glass, mica, potter's clay, silica, asbestos, magnesium silicate, magnesium carbonate, alumina and polyethylene terephthalate in powder form.

The photopolymerisable materials used in this invention are readily photopolymerised by actinic radiation having wavelengths generally between 2000 and 8000 Angstroms. Practical sources of such actinic radiation include carbon arc lamps, super high pressure mercury lamps, high pressure mercury lamps, low pressure mercury lamps, UV fluorescent lamps, xenon lamps and sunlight.

In one preferred embodiment of the invention, relief printing plates are produced from the photopolymerisable elements by a process which involves exposing the element to actinic light from both sides of the element. The self-supporting plastics film or sheet for use in such an element should be transparent to the wavelength of light employed for the photopolymerisation.

The photopolymerised layers are retained with excellent adhesion to the film or sheet via the adhesive layer and exhibit a remarkably sharp definition of the applied image since the photopolymerisation initiator (i) has a high density to ultra-violet light which is normally used for photopolymerisation and hence anti-halo properties (i.e. the adhesive layer typically has an optical density to ultra-violet light in the region 0.1 to 0.5). Excellent removal of the uncured regions of the photopolymerisable layer is also achieved and it has been discovered that very thin base layers for the cured image regions imposed on the photopolymerisable layer are retained with the photopolymerisation initiator admixture according to the invention. The relative amounts and the nature of the photopolymerisation initiator admixture in the adhesive layer determine the thickness of the retained base layer and it has been found that the adhesive layer formulation according to the present invention results in a thinner retained base layer than has been possible heretofore, e.g. according to the teachings of British patent specification No. 1,321,108. Thus, in order to obtain a thin base layer, e.g. in the region of 50 μm or less, the minimum effective amount of one of the photopolymerisation initiators decreases as the amount of the other photopolymerisation initiator increases. Accordingly, admixtures consisting of (by weight based upon the weight of the plastics binder in the adhesive layer) 2.5% of benzoin isopropyl ether and 0.1% of 4,4'-bis(dimethylamino)-benzophenone; 1.0% of benzoin isopropyl ether and 0.25% of 4,4'-bis(dimethylamino)benzophenone; and 5% of benzoin isopropyl ether and 0.25% of dimethylaminobenzaldehyde provide acceptably thin base layers when the photopolymerisable layer comprises 'Hercules' FD resin whilst an admixture of 1% of benzoin isopropyl ether and 0.1% of 4,4'-bis(dimethylamino)benzophenone provides an unacceptably thick base layer with the same photopolymerisable layer.

BRIEF DESCRIPTION OF THE DRAWING

The configuration of a film base according to the invention is described below together with its use in the production of a photorelief printing plate and with reference to the accompanying drawings, in which.

DETAILED DESCRIPTION OF INVENTION

Figure 1:
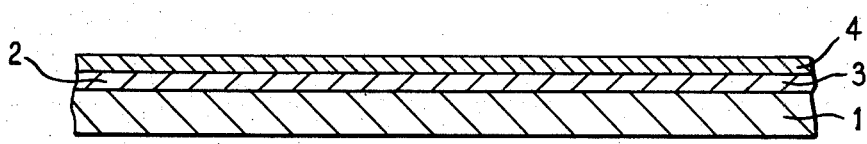
FIG. 1 is a cross-sectional view of a film base comprising a thermoplastics film and an adhesive layer.

FIG. 1 shows a conventional clear biaxially oriented and heat-set polyethylene terephthalate film 1 whose surface 2 has been pretreated by coating with a solution consisting of 5.0 g p-chloro-m-cresol, 1.0 g partially hydrolysed copolymer of vinyl chloride and vinyl acetate (available commercially as 'Vinylite' VAGH) in 100 ml of acetone to provide a wet coat weight of 100 mg/dm$^2$ and drying for 2 minutes at 90° C., the dried layer being shown by the numeral 3 in FIG. 1. An adhesive layer 4 was produced by coating an adhesive composition onto the pretreatment layer 3. The applied adhesive composition was dried by heating for 2 minutes at 100° C. to a dry adhesive layer 4 of thickness 7 μm.

Figure 2:
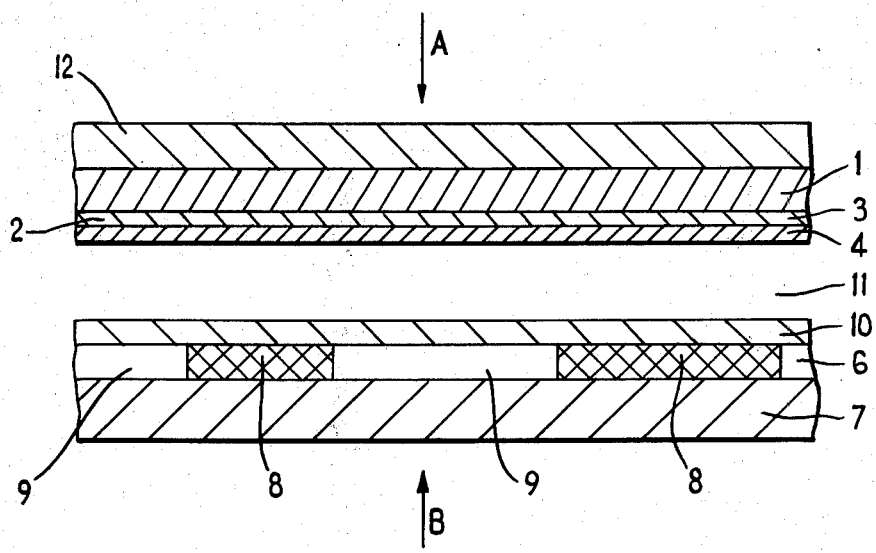
FIG. 2 is a cross-sectional view of the film base shown in FIG. 1 assembled with a photopolymerisable layer and positioned for exposure to light through a master.
Figure 3:
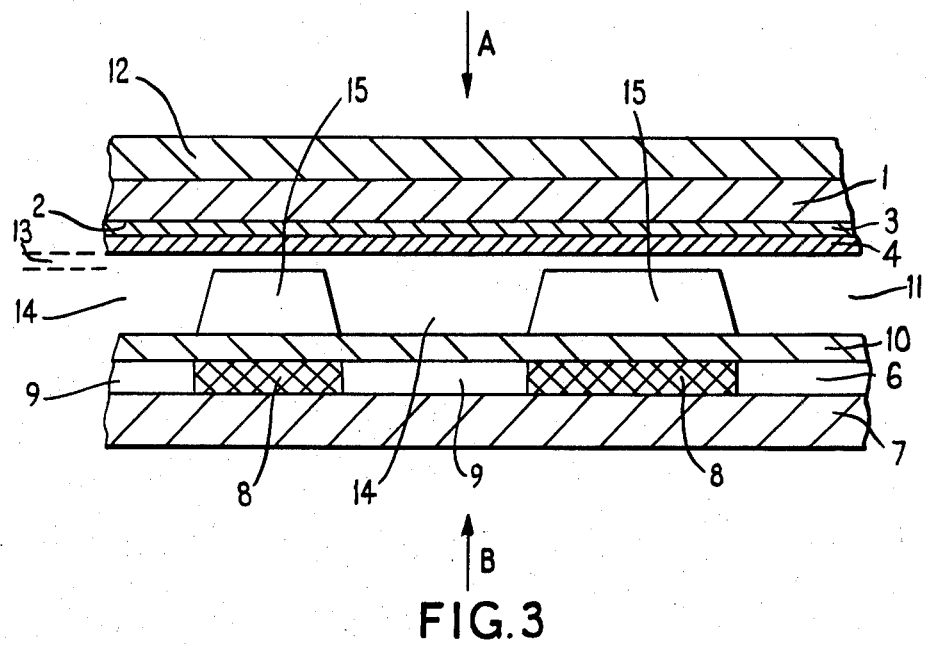
FIG. 3 illustrates the effect of exposing to light the assembly shown in FIG. 2.

The film base shown in FIG. 1 may be employed in the production of a photorelief plate as illustrated in FIGS. 2 and 3. The sequence of production involves locating a master 6 upon a supporting glass plate 7. The master 6 comprises a conventional photographic negative image of the pattern which is to be deposited on the film base material and has non-radiation transmitting regions 8 of deposited silver and transmitting regions 9. For simplicity of illustration, the film support and substratum layers of the master are not shown in the drawings. A protective radiation-transmitting thermoplastics film 10 was placed over the master 6. A layer 11 of photopolymerisable material consisting of 'Hercules' FD resin which is available commercially for the production of newspaper printing plates was applied over the protective film 10 by pouring and spreading to a uniform thickness. The film base as illustrated in FIG. 1 was then positioned over the layer 11 with the adhesive layer 4 in contact with the photopolymerisable material. The photopolymerisable material is curable by ultraviolet light. A glass plate 12 was then located over the film base material.

A short exposure, say of about 12 seconds, to ultraviolet light from above the film base material and in the direction of the arrow A was applied to bond the layer 11 to the adhesive layer 4 and to cure and harden a base layer 13 (see FIG. 3) of the photopolymerisable material as a foundation for the photorelief pattern. A longer exposure, of about 60 seconds duration, to ultra-violet light was next applied through the master 6 in the direction of the arrow B to cure and harden image regions 14 of the photopolymerisable material corresponding to the transmitting regions 9 of the master 6.

Figure 4:
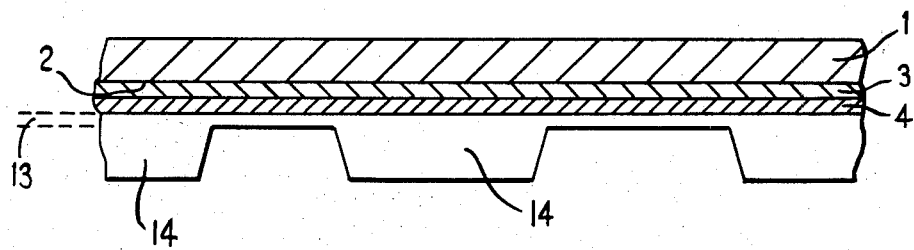
FIG. 4 is a cross-sectional view of the completed printing plate.

Finally, the film assembly was separated from the master 6 and the glass plate 7 and the protective film 10 was peeled from the photopolymerisable layer 11. The assembly was then washed in a solvent, such as a solution of borax, for the photopolymerisable material to remove those uncured regions 15 corresponding to the non-transmitting regions 8 of the master 6. The completed printing plate is illustrated in FIG. 4 and has printing relief regions 14. The overall thickness of the base layer 13 and the relief regions 14 was about 500 μm.

The relief patterns of the printing plates according to this invention have tenacious adhesion to the film base material such that they resist repeated use in rotary printing machines without damage. Furthermore, halftone detail and images of sharp line definition can be deposited with strong adhesion. The printing plates are therefore suitable for use in continuous letterpress and flexographic printing machines and may, for example, be used for the printing of newpapers, journals, business forms and other printing applications.

Optical densities quoted in this specification were measured by means of a Macbeth Quantalog TD 528 densitometer using diffused light and an 18A Wratten filter.

The following Examples of the Applicants' invention and Comparative Examples further illustrate the invention and in particular demonstrate that thinner base layers (represented by reference numeral 13 in the drawings) may be obtained with the preferred photopolymerisation initiator admixtures of the invention.

EXAMPLES 1 TO 9 AND COMPARATIVE EXAMPLES A TO H

Using the procedure described above in relation to the drawings, adhesive layers derived from adhesive compositions of varying formulation were applied to films of polyethylene terephthalate. The adhesive compositions had the following general formulation, the quantities of the photoinitiators used in each composition being shown in Table 1:

| Ingredients | Quantity |
|---|---|
| Saturated polyurethane which is commercially available as 'Estane' 5715 | 100 g |
| Benzoin isopropyl ether which is commercially available as 'Glocure' 31 | see Table 1 |
| 4,4'-bis(dimethylamino)-benzophenone | see Table 1 |
| Particulate silica which is commercially available as 'Gasil' 64 | 4.5 g |
| Methyl ethyl ketone | 500 ml |

Photopolymerisable elements were produced from the resulting film bases by the procedure described above with reference to the drawings. Printing plates produced from the photopolymerisable elements of Examples 1 to 9 had excellent image definition and adhesion to the film base.

The minimum base layer (13) thickness of the cured photopolymerisation layer which can be retained with satisfactory adhesion upon the film base was assessed by casting the photopolymerisable material into the well of a rectangular template about 625 mμ thick supported upon a biaxially oriented film of polyethylene terephthalate. The film base was placed over the photopolymerisable material with the adhesive layer in contact with the photopolymerisable material. A master comprising a conventional silver/gelatin emulsion in which the deposited silver image had progressively increasing density across the master was placed over the film base and the assembly was exposed to ultra-violet light for 45 seconds through the master. The layer of photopolymerisable material adhering to the film base was washed in a solution of borax to remove the uncured photopolymerisable material. The minimum thickness of cured photopolymerisable material retained upon the film base was then measured, with the results shown in Table 1.

TABLE 1

| Example or Comparative Example Number | Quantity of benzoin isopropyl ether ('Glocure' 31) in adhesive composition in g | Quantity of 4,4'-bis(dimethylamino)-benzophenone in adhesive composition in g | Minimum thickness of base layer in μm | Optical density |
|---|---|---|---|---|
| A | 5.0 | None | 89 | 0.08 |
| B | 8.0 | None | 30 | 0.08 |
| C | 10.0 | None | 29 | 0.08 |
| 1 | 5.0 | 0.05 | 25 | 0.15 |
| 2 | 5.0 | 0.1 | 18 | 0.17 |
| 3 | 5.0 | 0.15 | 17 | 0.19 |
| 4 | 5.0 | 0.25 | 14 | 0.30 |
| 5 | 5.0 | 0.5 | 15 | 0.51 |
| D | 2.5 | None | 117 | 0.08 |
| 6 | 2.5 | 0.25 | 19 | 0.28 |
| 7 | 2.5 | 0.1 | 13 | 0.18 |
| E | 1.0 | None | 160 | 0.08 |

TABLE 1-continued

| Example or Comparative Example Number | Quantity of benzoin isopropyl ether ('Glocure' 31) in adhesive composition in g | Quantity of 4,4'-bis(dimethylamino)-benzophenone in adhesive composition in g | Minimum thickness of base layer in μm | Optical density |
|---|---|---|---|---|
| 8 | 1.0 | 0.25 | 14 | 0.28 |
| F | 1.0 | 0.1 | 130 | 0.18 |
| G | 0.5 | None | 210 | 0.08 |
| 9 | 0.5 | 0.25 | 15 | 0.26 |
| H | None | 0.25 | 81 | 0.27 |

Whilst the minimum thicknesses of the base layers produced in Comparative Examples B and C were of acceptable magnitude, the assemblies were unacceptable because the adhesive layers were contaminated by the migration of crystals of benzoin isopropyl ether to their surfaces.

EXAMPLES 10 TO 16 AND COMPARATIVE EXAMPLES I TO O

The procedure of Examples 1 to 9 and Comparative Examples A to H was repeated using alternative photoinitiator mixtures, the adhesive compositions having the general formulation given below:

| Ingredients | Quantity |
|---|---|
| Saturated polyurethane which is commercially available as 'Estane' 5715 | 100 g |
| Photoinitiator 'X1' named in Table 2 | see Table 2 |
| 4,4'-bis(dimethylamino)-benzophenone | see Table 2 |
| Particulate silica which is commercially available as 'Gasil' 64 | 4.5 g |
| Methyl ethyl ketone | 500 ml |

The minimum thickness of the cured base layer is also noted in Table 2. Printing plates produced from the photopolymerisable elements of Examples 10 to 16 had excellent image definition and adhesion to the film base. The minimum thicknesses of the base layers produced in Comparative Examples I to O were unacceptably thick.

TABLE 2

| Example or Comparative Example Number | Photoinitiator 'X1' and quantity in adhesive composition | Quantity of 4,4'-bis(dimethylamino)-benzophenone in adhesive composition in g | Minimum thickness of base layer in μm | Optical density |
|---|---|---|---|---|
| I | Benzophenone 5.0 g | None | 135 | 0.08 |
| 10 | Benzophenone 5.0 | 0.25 | 17 | 0.26 |
| J | Benzoin isobutyl ether ('Glocure' 41) 5.0 g | None | 56 | 0.08 |
| 11 | Benzoin isobutyl ether ('Glocure' 41) 5.0 g | 0.25 | 19 | 0.26 |
| K | Benzil 5.0 g | None | 226 | 0.08 |
| 12 | Benzil 5.0 g | 0.25 | 15 | 0.30 |
| L | Benzoin 5.0 g | None | 112 | 0.08 |
| 13 | Benzoin 5.0 g | 0.25 | 20 | 0.29 |
| M | Anthraquinone 2.5 g | None | 151 | 0.08 |
| 14 | Anthraquinone 2.5 g | 0.25 | 15 | 0.34 |
| N | 9,10-phenanthraquinone 2.5 g | None | 95 | 0.20 |
| 15 | 9,10-phenanthraquinone 2.5 g | 0.25 | 13 | 0.37 |
| O | 1-Chloroanthraquinone 5.0 g | None | 124 | 0.27 |
| 16 | 1-Chloroanthraquinone 5.0 g | 0.25 | 11 | 0.46 |

EXAMPLES 17 TO 20 AND COMPARATIVE EXAMPLES P TO S

The procedure of Examples 1 to 9 and Comparative Examples A to H was repeated using alternative photoinitiator mixtures and plastics binders, the adhesive compositions having the following general formulation:

| Ingredients | Quantity |
| --- | --- |
| Plastics binder named in Table 3 | 100 g |
| Photoinitiator 'X2' named in Table 3 | see Table 3 |
| Photoinitiator 'X3' named in Table 3 | see Table 3 |
| Particulate silica which is commercially available as 'Gasil' 64 | 4.5 g |
| Methyl ethyl ketone | 500 ml |

The minimum thickness of the cured base layer is also noted in Table 3. Printing plates produced from the photopolymerisable elements of Examples 17 to 20 had excellent image definition and adhesion to the film base. The minimum thicknesses of the base layers produced in Comparative Examples P to S were unacceptably thick.

TABLE 3

| Example or Comparative Example Number | Plastics binder | Photoinitiator 'X2' and quantity in adhesive composition | Photoinitiator 'X3' and quantity in adhesive composition | Minimum thickness of base layer in μm | Optical density |
| --- | --- | --- | --- | --- | --- |
| 17 | Saturated polyurethane ('Estane' 5715) | Benzoin isopropyl ether ('Glocure' 31) 5.0 g | Dimethylaminobenzaldehyde 0.25 g | 37 | 0.15 |
| P | Saturated polyurethane ('Estane' 5715) | Benzoin isopropyl ether ('Glocure' 31) 2.5 g | Dimethylaminobenzaldehyde 0.25 g | 88 | 0.14 |
| Q | Polychloroprene ('Alloprene' 125) | Benzoin isopropyl ether ('Glocure' 31) 5.0 g | None | 376 | 0.10 |
| 18 | Polychloroprene ('Alloprene' 125) | Benzoin isopropyl ether ('Glocure' 31) 5.0 g | 4,4'-bis(dimethylamino)-benzophenone 0.25 g | 9 | 0.29 |
| R | Vinylidene chloride/acrylonitrile copolymer ('Saran' F310) | Benzoin isopropyl ether ('Glocure' 31) 5.0 g | None | 175 | 0.08 |
| 19 | Vinylidene chloride/acrylonitrile copolymer ('Saran' F310) | Benzoin isopropyl ether ('Glocure' 31) 5.0 g | 4,4-bis(dimethylamino)-benzophenone 0.25 g | 17 | 0.19 |
| S | Partially hydrolysed copolymer of vinyl chloride/vinyl acetate ('Vinylite' VAGH) | Benzoin isopropyl ether ('Glocure' 31) 5.0 g | None | 277 | 0.08 |
| 20 | Partially hydrolysed copolymer of vinyl chloride/vinyl acetate ('Vinylite' VAGH) | Benzoin isopropyl ether ('Glocure' 31) 5.0 g | 4,4-bis(dimethylamino)-benzophenone 0.25 g | 10 | 0.36 |

In a modification of Example 20, 1.0 g of hexamethoxy methyl melamine (commercially available as 'Cymel' 300 and 0.25 g of p-toluene sulphonic acid was added to the adhesive composition coating formulation of Example 20 in order to cross-link the adhesive layer thereby providing resistance to temperatures up to 150° C. Cross-linking had no substantial effect upon the other properties of the element.

EXAMPLES 21 AND 22 AND COMPARATIVE EXAMPLES T AND U

The procedure of Examples 1 to 9 and Comparative Examples A to H was repeated using alternative photoinitiator mixtures and plastics binders, the adhesive compositions being as follows:

| Comparative Example T | |
| --- | --- |
| Ingredients | Quantity |
| Cellulose acetate propionate ('Cellit' PR900) | 35.0 g |
| Benzoin isopropyl ether ('Glocure' 31) | 1.75 g |
| Particulate silica ('Gasil' 64) | 4.5 g |
| Methyl ethyl ketone | 500 ml |

EXAMPLE 21

Composition of Comparative Example T with the addition of 0.08 g 4,4'-bis(dimethylamino)-benzophenone.

| Comparative Example U | |
| --- | --- |
| Ingredients | Quantity |
| Copolymer of 30 mole % butyl methacrylate and 70 mole % methyl methacrylate | 100 g |
| Benzoin isopropyl ether ('Glocure' 31) | 5.0 g |
| Particulate silica ('Gasil' 64) | 4.5 g |
| Methyl ethyl ketone | 850 ml |

EXAMPLE 22

Composition of Comparative Example U with the addition of 0.25 g 4,4'-bis(dimethylamino)-benzophenone.

The minimum thickness of the cured base layer is noted in Table 4. Printing plates produced from the photopolymerisable elements of Examples 21 and 22 had excellent image definition and adhesion to the film base. The minimum thicknesses of the base layers produced in Comparative Examples T and U were unacceptably thick.

TABLE 4

| Example or Comparative Example Number | Minimum thickness of base layer in μm | Optical density |
|---|---|---|
| T | 184 | 0.07 |
| 21 | 29 | 0.15 |
| U | 469 | 0.08 |
| 22 | 6 | 0.15 |

EXAMPLES 23 TO 25 AND COMPARATIVE EXAMPLE V

The procedure of Examples 1 to 9 and Comparative Examples A to H was repeated using alternative adhesive compositions of the following general formulation:

| Ingredients | Quantity |
|---|---|
| Saturated polyurethane which is commercially available as 'Estane' 5715 | 40 g |
| Benzoin isopropyl ether which is commercially available as 'Glocure' 31 | 2 g |
| Photoinitiator 'X4' named in Table 5 | see Table 5 |
| Particulate silica which is commercially available as 'Gasil' 64 | 2 g |
| Methyl ethyl ketone | 160 g |

The photopolymerisable element was exposed to ultraviolet light using alternative exposure times as set out in Table 5. The uncured regions of photopolymerisable material were removed by washing for 4 minutes at 40° C. in an aqueous solution of 4% by weight of borax.

The minimum thickness of cured photopolymerisable material and the optical density of the adhesive layer were determined and are shown in Table 5.

TABLE 5

| Example or Comparative Example Number | Photoinitiator 'X4' | Amount of Photoinitiator 'X4' in adhesive composition in g | Exposure time in seconds | Minimum thickness of base layer in μm | Optical density |
|---|---|---|---|---|---|
| 23 | 4-dimethylamino-trifluoromethyl phenyl ketone | 0.1 | 50 | 50 | 0.19 |
| 24 | 4-dimethylamino-acetophenone | 0.1 | 40 | 50 | 0.08 |
| 25 | 4,4'-bis(dimethylamino)-benzophenone | 0.1 | 60 | 12 | 0.24 |
| V | None | None | 40 | 75 | 0.03 |

We claim:

1. A photopolymerisable element which comprises a self-supporting plastics film or sheet having an adhesive layer superimposed upon at least one surface thereof and a photopolymerisable layer superimposed upon the adhesive layer, said adhesive layer having a thickness of from 0.05 to 20 μm and being free of photopolymerisable component and comprising a non-photopolymerisable plastics binder and a photopolymerisation initiator comprising an admixture of:

(i) a compound having the formula:

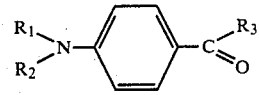

wherein $R_1$ and $R_2$ are the same or different and are selected from hydrogen, or a lower alkyl group having up to 6 carbon atoms and $R_3$ is the same as or different from $R_1$ or $R_2$ and is selected from hydrogen, a lower alkyl group having up to 6 carbon atoms, a partially or completely halogenated alkyl group having up to 6 carbon atoms or a group of the formula:

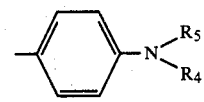

in which $R_5$ and $R_4$ are the same or different and are selected from the same substituents as $R_1$ and $R_2$, said compound being present in an amount 0.01 to 2.0% by weight based upon the weight of the plastics binder; and (ii) another photopolymerisation initiator present in an amount 0.1 to 7% by weight based upon the weight of the plastics binder.

2. A photopolymerisable element according to claim 1, in which $R_1$ and $R_2$ of compound (i) are lower alkyl groups.

3. A photopolymerisable element according to claim 1, in which $R_3$ of compound (i) is hydrogen, $CF_3$ or:

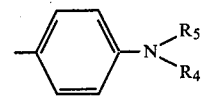

in which $R_5$ and $R_4$ are lower alkyl groups.

4. A photopolymerisable element according to claim 1, in which compound (i) is:

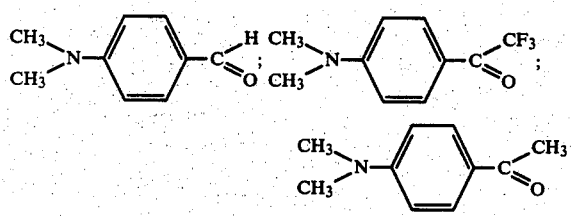

or 4,4'-bis(dimethylamino)-benzophenone.

5. A photopolymerisable element according to claim 1, in which the amount of compound (i) in the adhesive layer is in the range 0.01 to 0.5% by weight based upon the weight of the plastics binder.

6. A photopolymerisable element according to claim 1, in which the photopolymerisation initiator (ii) is selected from the group consisting of benzoin, benzoin isopropyl ether, benzoin isobutyl ether, benzoin methyl ether, benzoin ethyl ether, α-methyl benzoin, benzil, anthraquinone, diacetyl anthraquinone, 1-chloroanthraquinone, 9,10-phenanthraquinone, diphenyl disulphide, 2-naphthalenesulphonyl chloride, ω-bromoacetophenone, eosin, thionin, and benzophenone.

7. A photopolymerisable element according to claim 1, in which the amount of photopolymerisation initiator (ii) in the adhesive layer is in the range 0.25 to 5.0% by weight based upon the weight of the plastics binder.

8. A photopolymerisable element according to claim 4, in which the photopolymerisation initiator comprises an admixture of isopropyl benzoin ether and 4,4'-bis(-dimethylamino)-benzophenone.

9. A photopolymerisable element according to claim 8, in which the photopolymerisation initiator comprises an admixture of about 5.0% by weight of isopropyl benzoin ether and about 0.25% by weight of 4,4'-bis(-dimethylamino)-benzophenone, both amounts being based upon the weight of the plastics binder.

10. A photopolymerisable element according to claim 1, in which the plastics binder of the adhesive layer is selected from the group consisting of cellulose esters, homopolymers and copolymers of vinyl halogenoesters, polyurethanes, alkyd resins, polymers and copolymers of acrylic acid and/or methacrylic acid and/or esters thereof, synthetic rubbers, polymers and copolymers of vinyl acetate which may optionally be partially hydrolysed, polymers and copolymers of vinyl chloride or vinylidene chloride, epoxy resins and polymers and copolymers of vinyl butyral.

* * * * *